United States Patent [19]

Shimizu et al.

[11] 4,435,741
[45] Mar. 6, 1984

[54] ELECTRICAL CIRCUIT ELEMENTS COMBINATION

[75] Inventors: Masami Shimizu, Tokyo; Masanori Uchidoi, Kanagawa, both of Japan

[73] Assignee: Canon Kabushiki Kaisha

[21] Appl. No.: 296,571

[22] Filed: Aug. 26, 1981

[30] Foreign Application Priority Data

Sep. 3, 1980 [JP] Japan .............................. 55-122174
Nov. 13, 1980 [JP] Japan .......................... 55-162244[U]

[51] Int. Cl.$^3$ ............................................ H05K 1/18
[52] U.S. Cl. ..................................... 361/401; 29/521; 339/17 CF
[58] Field of Search ................. 29/838, 740, 521, 741, 29/827, 588; 339/17 CF; 361/403, 400, 401; 357/70; 174/52 FP

[56] References Cited

U.S. PATENT DOCUMENTS 3,184,699  5/1965  Spera .............................. 339/17 CF
3,416,122 12/1968  Kinkaid .......................... 339/17 CF
3,454,921  7/1969  Coleman et al. ............ 339/17 CF X
3,663,920  7/1970  Lapham ........................... 361/403 X
3,729,804  5/1973  Middleton ....................... 29/521 X
3,900,937  8/1975  Schleicher ...................... 29/521 X

FOREIGN PATENT DOCUMENTS 48-23960  7/1973  Japan .
53-19563  2/1978  Japan .

Primary Examiner—Howard N. Goldberg
Assistant Examiner—Carl J. Arbes
Attorney, Agent, or Firm—Toren, McGeady and Stanger

[57] ABSTRACT

A method whereby an integrated circuit element such as IC or LSI and the like on a printed circuit board and the external leads of the circuit element are electrically connected to the conductor patterns on the circuit board, in which holes are provided in the circuit element and the conductor patterns so as to effect quick and accurate positioning and mounting.

6 Claims, 10 Drawing Figures

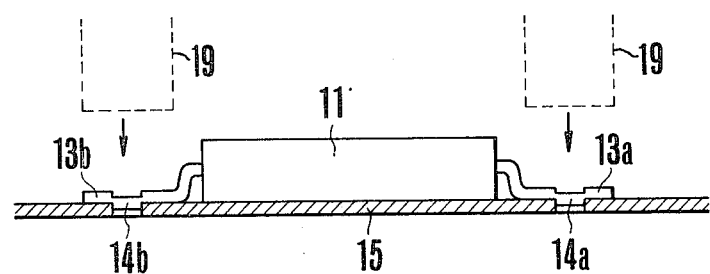
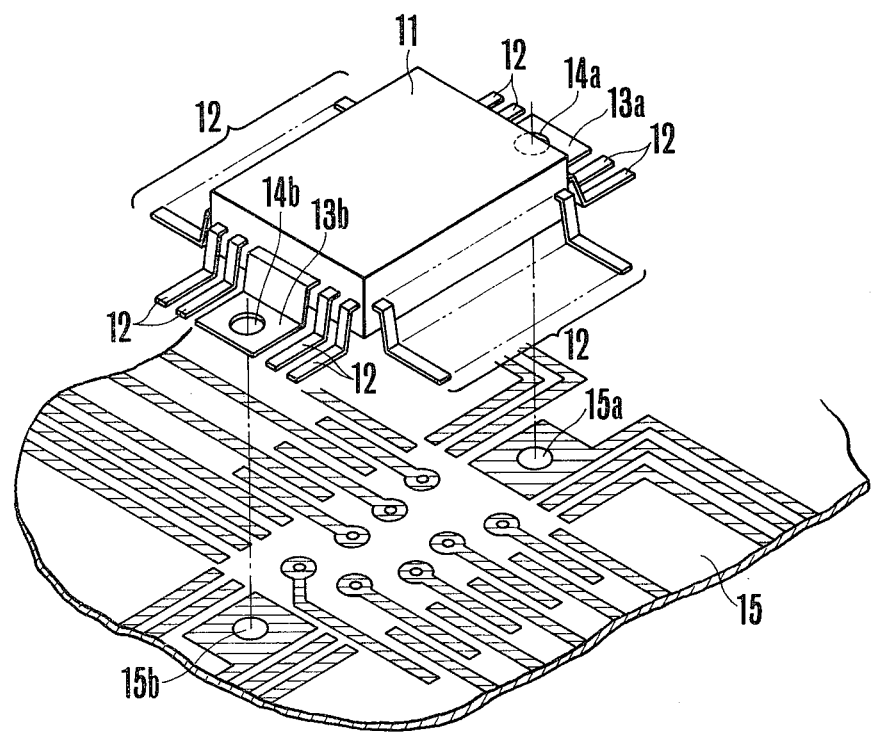

ELECTRICAL CIRCUIT ELEMENTS COMBINATION

BACKGROUND OF THE INVENTION

1. Field of the Invention

In an integrated circuit element, external leads are led out the element body and are electrically connected with the circuit board so as to deliver and receive the electrical signals. Cameras, copiers and other precision instruments are becoming more compact and electronic techniques are being increasingly applied thereon in such a manner that integrated circuit elements such as IC or LSI are increasingly made use of. In such devices, the increase of the number of the external leads of the integrated circuit element and the small width between the conductor patterns on the circuit board make the positioning operations so difficult that conventional methods and devices no longer provide adequate fidelity with regard to positioning accuracy.

Until now, in order to align the external leads projecting at the side of the molded integrated circuit element with the conductor patterns on the circuit board a mounting device has been used by means of which the projections provided on the molded bay are engaged in the openings provided in the fixed portion of the circuit board. (Japanese utility model publication Sho. 48-23960). In the case of the above-mentioned device the external leads are not directly aligned with the conductor patterns on the circuit board so that there is a danger that the external leads will not correspond to the conductor pattern, thereby causing difficulty in obtaining high positioning accuracy.

SUMMARY OF THE INVENTION

The above-mentioned technical problems taken into consideration, it is an object of the present invention to provide a method and a device by means of which the increase of positioning fidelity of the external leads and the conductor patterns, the automatization of the electrical connection such as soldering and the simplification of the fixing work of the electrical circuit element such as the integrated circuit element on the printed circuit board can be achieved.

It is another object of the present invention to provide a method in accordance with which precise positioning is possible without making use of a special device or tool when the external leads of the integrated circuit element are mounted on the conductor patterns on the printed circuit board.

Briefly, the present invention may be described as a method and device for positioning the external leads of an electrical circuit element on the conductor patterns on a printed circuit board wherein on the external leads and on the printed circuit board holes are provided for aligning the electrical circuit element on the printed circuit board.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

In the drawings:

FIGS. 8 and 9 are, respectively, a sectional view and a perspective view of another embodiment the invention.

DESCRIPTION OF THE PREFERRED EMBODIMENT

Figure 1:
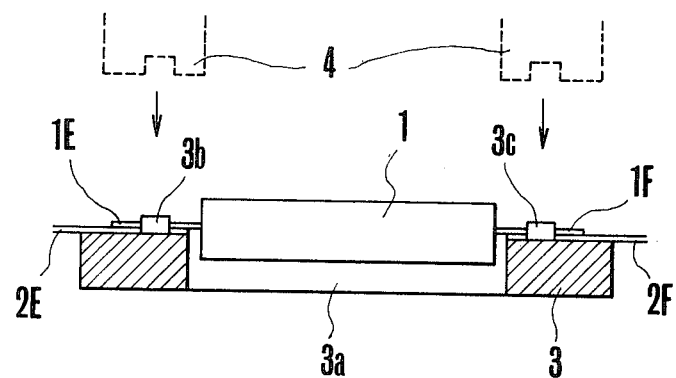
FIG. 1 is a sectional view of an embodiment of the present invention.
Figure 2:
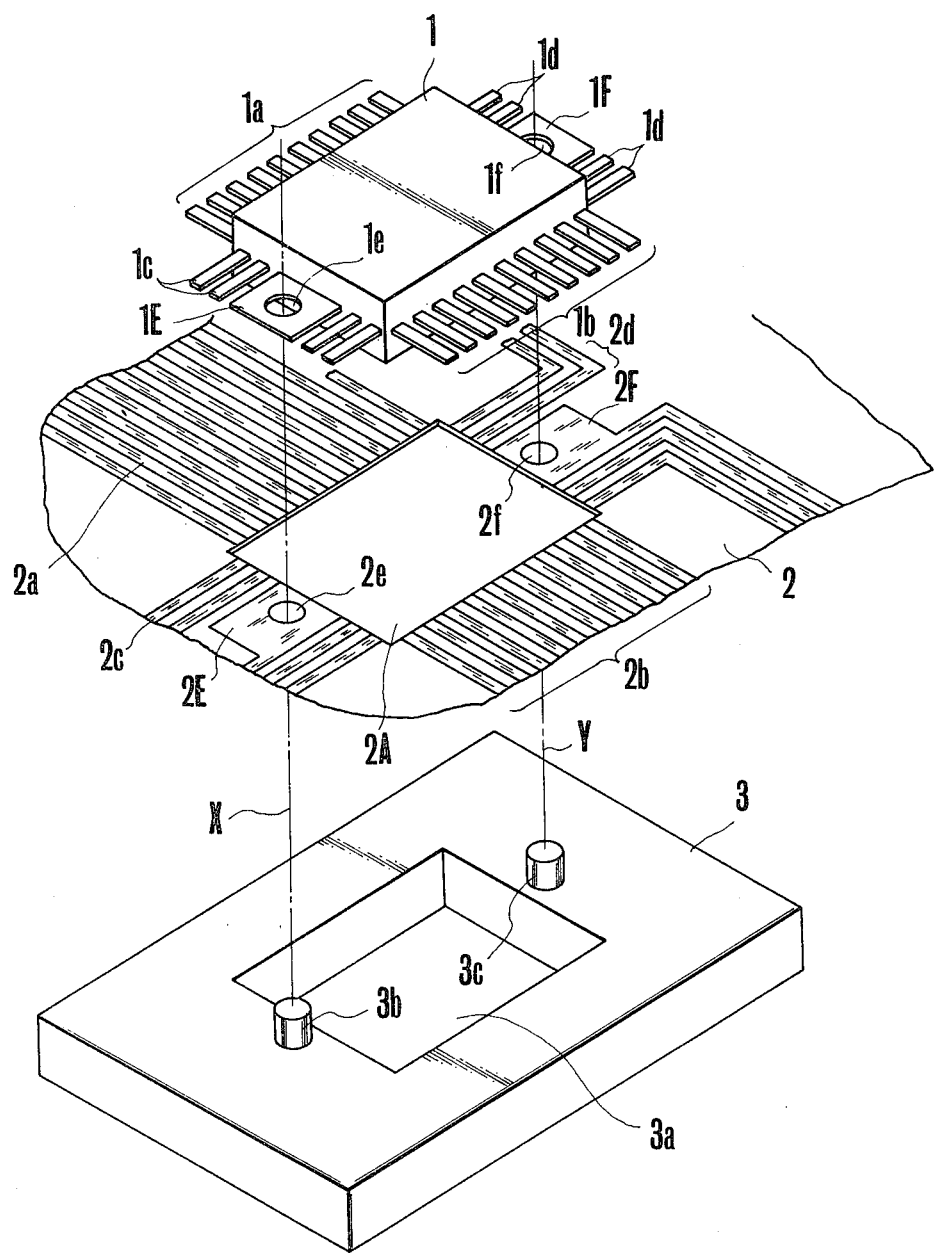
FIG. 2 is a perspective view of the embodiment of FIG. 1.

In the present inventionthe electrical circuit elements are integrated circuit elements such as an IC, LSI and so on. FIGS. 1 and 2 show the first embodiment of the present invention. In case of this embodiment the printed circuit board is provided with openings in which the integrated circuit elements are to be embedded. In accordance with the method and device to be described hereinafter, the printed circuit board is provided with the openings in which the integrated circuit elements are to be embedded, the integrated circuit elements are embedded in the openings in the printed circuit board and the conductor patterns on the circuit board and the external leads of the integrated circuit elements are positioned. In FIGS. 1 and 2, 1 is the main body of an integrated circuit element covered with molding and the like. The sides of the main body 1 are provided with external leads 1a, 1b, 1c, 1d ... for delivering or receiving electrical signals. 1E, 1F are external leads provided with holes 1e, 1f for positioning to be explained later. 2 is the printed circuit board, in which the hole 2A in which the integrated circuit element 1 is to be embedded is provided. The hole 2A is provided on the circumference with conductor patterns 2a, 2b, 2c, 2d and 2E and 2F to be connected with the external leads 1a, ... 1d, 1E, 1F, whereby 2E and 2F are provided with holes at positions corresponding to the holes of the external leads 1E, 1F. 3 is a tool for aligning the external leads with the conductor pattern of the printed circuit board, provided with an opening 3a for the integrated circuit element body and with projections 3b, 3c.

The printed circuit board is placed on the tool 3 with the projections 3b, 3c aligned with the holes 2e, 2f of the circuit board, while the integrated circuit element body is embedded in the opening 2A, 3a, whereby the external leads are engaged with the projections 3c, 3b of the tool 3. In this way the external leads 1a, ... 1F are kept at the positions at which they are connected with the conductor pattern on the circuit board (1a-2a, 1b-2b, 1c-2c, 1d-2d, 1E-2E, 1F-2F). Then the external leads are fixed with the conductor patterns by means of a soldering device 4.

Figure 3:
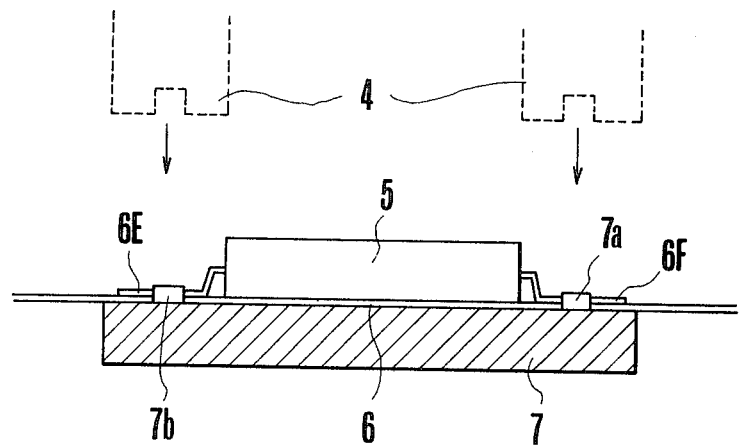
FIG. 3 is a sectional view of another embodiment of the invention.
Figure 4:
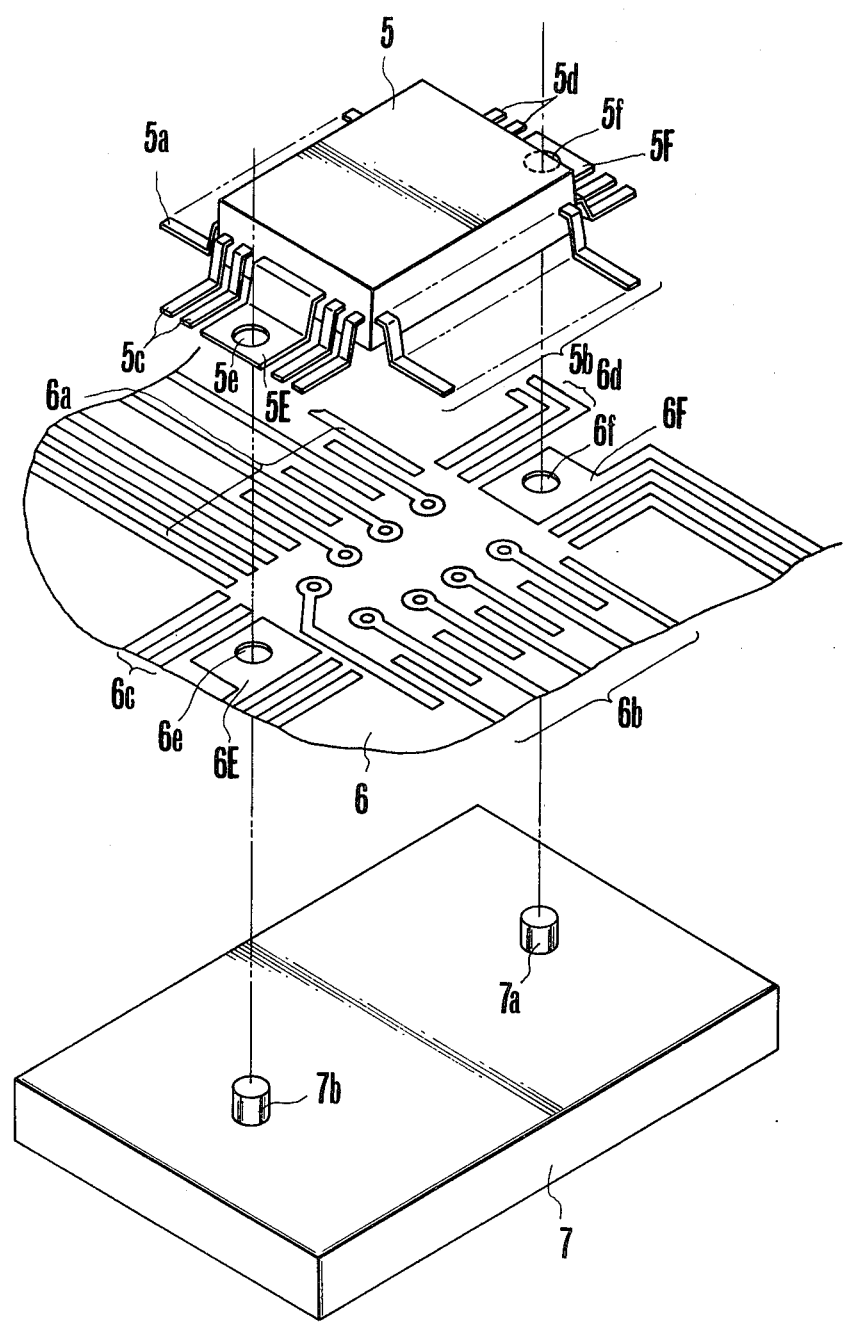
FIG. 4 is a perspective view of the embodiment of FIG. 3.

FIGS. 3 and 4 show another embodiment of the present invention. A precision instrument such as a camera, a desk calculator, a time piece and copiers and the like must all be compact and light so that the space occupied with the electrical circuit construction will be small, while a large scale integrated circuit may be made use of. Thus, it is necessary to print the conductor pattern also on the circuit board portion of the electrical circuit element arranged on the printed circuit board in order to make the space of the circuit board small. The present embodiment is quite advantageous for such a case. In the drawing, 5 is the electrical circuit element such as the integrated circuit element, 5a ... 5F the external leads, which in the case of the present embodiment are bent in the shape of an L, in such a manner that the lower surface of the element 5 and the bent external leads are laid on the printed circuit board 6. 6a ... 6F are the conductor patterns printed on the circuit board 6. 5e, 5f are holes formed in the bent external leads 5E, 5F, provided at the position corresponding to those of the holes 6e, 6f in the conductor patterns 6E, 6F on the printed circuit board. 7 is the tool for aligning the external leads of the integrated circuit element 5 with the conductor pattern of the circuit board 6, having projections 7a, 7b on the surface.

The efficiency of the present embodiment is the same as that of the first embodiment, whereby the circuit element 5 is not embedded in the circuit board 6 so that the conductor pattern can be printed on the circuit board on which the circuit element is placed.

As explained above in accordance with the present invention by providing holes (1e, 1f, 6e, 6f) for aligning the external leads with the conductor patterns instead of the alignment of the electrical circuit element with the printed circuit board that of the external leads with the conductor pattern itself can be carried out so that the reliability of the positioning can be largely improved, whereby further the soldering efficiency can be much improved.

Further, in case of the present invention by automatically removing the tool 3, 7 after the positioning has been finished and the external leads are soldered with the conductor patterns, the soldering process can be automated.

Figure 5:
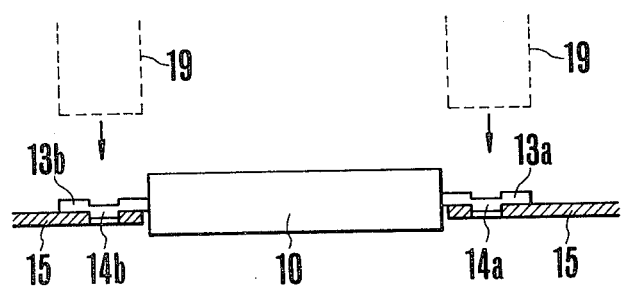
FIG. 5 is a sectional view of an embodiment of the integrated circuit structure mounting device of the present invention.
Figure 6:
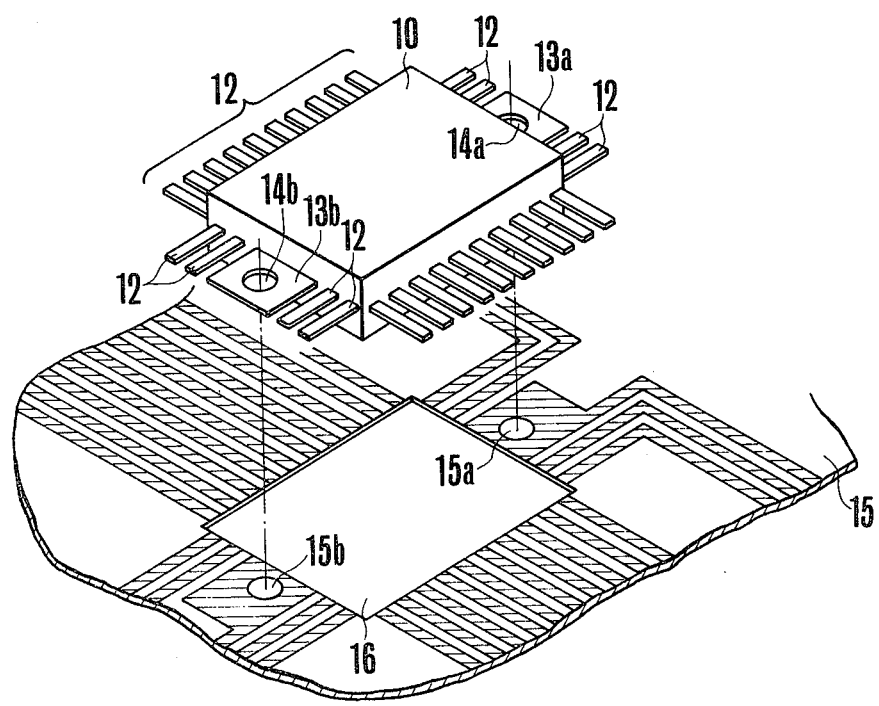
FIG. 6 is a perspective view of an embodiment of the mounting device of the present invention of the integrated circuit structure on the printed circuit board.

FIGS. 5-9 show further improvements of the present invention whereby the positioning can be accomplished without making use of the positioning tool. Instead of the positioning pin, projections are provided on one IC lead so as to be engaged into the holes in the printed board, whereby a mounting device with high precision and efficiency can be achieved. FIG. 5 shows the integrated circuit structure of the present invention mounted on the printed circuit board in section. FIG. 6 shows an embodiment of the integrated circuit structure of the present invention and the printed circuit board in perspective view. FIG. 7 shows the mounting device of the present invention in an enlarged section. In the drawing, 10 is the integrated circuit structure, 12 its leads, 13a and 13b the leads having the positioning projections 14a and 14b, and 15 the printed circuit board whose black portions are the conductor patterns. 15a and 15b are the positioning holes at the position corresponding to those of 14a and 14b, whereby one of the holes is a long one for absorbing the pitch difference between 14a-14b and 15a-15b. 16 is a hole for receiving the main body of the integrated circuit structure 1. In order to mount the integrated circuit structure 1 on the printed circuit board 15, as is shown in FIG. 7 the projections 14a and 14b are engaged respectively in the holes in the printed board, while the leads 12 of the structure 1 are aligned with the conductor pattern on the board 15 and then soldered with each other by means of a conventional solder device 19 shown in broken line.

Figure 7A:
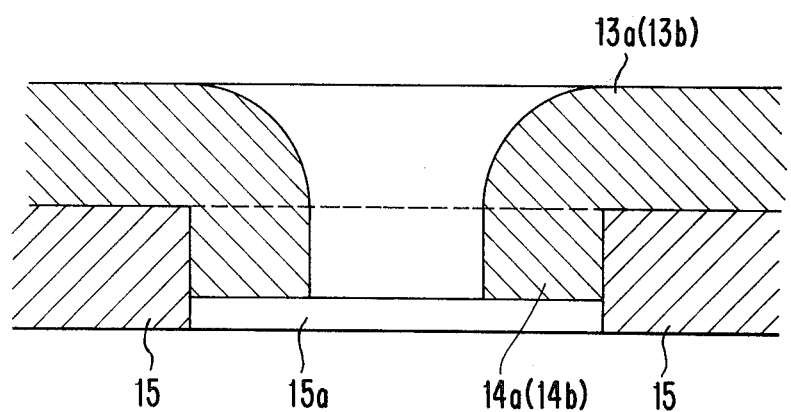
FIGS. 7a and 7b show the mounting devices of the present invention shown in FIGS. 5 and 6 in enlarged sectional views.
Figure 7B:
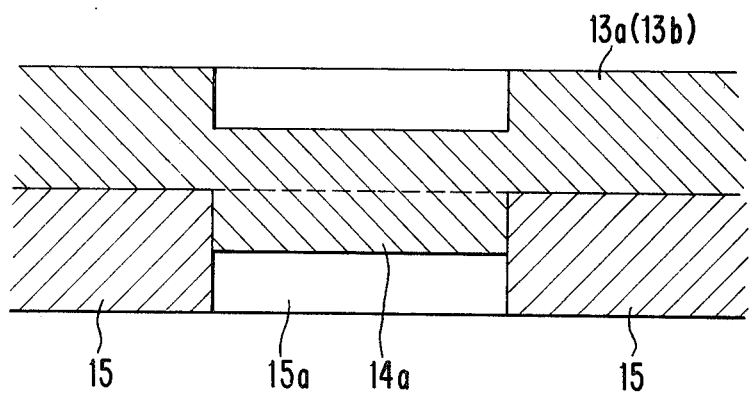

FIG. 7a shows an example of the projections 14a, 14b made with a burning process of the leads 13a, 13b in enlargement. FIG. 7b shows the projections 14a, 14b made with half a blanking process. In the drawing, 15 is the printed circuit board and 15a and 15b the holes in its conductor patterns.

FIGS. 8 and 9 respectively show another embodiment of the present invention in section and in perspective view, whereby the leads of the IC are bent. In the drawing, 11 is the integrated circuit structure, 12 the leads, 13a and 13b the leads having the positioning projections 14a and 14b, 15 the printed circuit board whose black portions are the patterns on the board and 15a and 15b the positioning holes at the positions corresponding to those of 14a and 14b. One of the holes is a long one for absorbing the pitch difference between 14a-14b and 15a-15b. As is shown in the drawings in accordance with the present embodiment in the same way as in the case of the first embodiment shown in FIGS. 3 and 4 the notch (6 in FIG. 4) for mounting the structure 11 on the board 15 is not necessary so that this part can be effectively made use of for wiring and thus high density wiring becomes possible. The working process of the projection is the same as that of the first embodiment so that further explanations are omitted here.

As explained above in detail, by making use of the integrated circuit mounting device of the present invention the correct positioning between the leads of IC and the conductor patterns of the board can be carried out easily without a special positioning tool, while the arrangement of the conductor patterns on the board can be effectively made, which is quite advantageous.

What is claimed is:

1. A combination of an integrated circuit element and a printed circuit board which provides an electrical connection, comprising:
   (a) an integrated circuit element having a plurality of external leads extended from sides thereof, wherein holes for positioning are provided at said external leads;
   (b) a printed circuit board having an opening to embed said integrated circuit element and conductor patterns to be connected to said external leads, wherein the conductor patterns to be connected to said external leads having said holes provided therein have holes having the same diameters as those of said external leads; and
   (c) whereby a positioning of said integrated circuit element and said printed circuit board is made based on the holes provided respectively on the external leads and on the conductor patterns.

2. A combination of an integrated circuit element and a printed circuit board which provides an electrical connection, comprising:
   (a) a printed circuit board having a plurality of conductor patterns provided therein for securing electrical conductance between circuit elements, wherein holes for positioning are provided at least in two of the conductor patterns;
   (b) an integrated circuit element having a plurality of external leads extending from sides thereof, wherein said external leads have forward ends so bent so as to be overlapped with the conductor patterns on the printed circuit boards and the external leads which are placed over the conductor patterns having the holes provided therein have holes provided therein with the same diameter as that of the holes provided in the conductor patterns; and (c) whereby a positioning of the integrated circuit element and the printed circuit board is made based on the holes provided respectively on the external leads and on the conductor patterns.

3. A combination of an integrated circuit element and a printed circuit board which provides an electical connection, comprising:

(a) a printed circuit board having a plurality of conductor patterns provided thereon for securing electrical conductance between circuit elements, wherein holes for positioning are provided at least in two of the conductor patterns;

(b) an integrated circuit element having a plurality of external leads extending from sides thereof, wherein the external leads which are overlapped with the conductor patterns of said printed circuit boards having holes provided therein have projections formed thereon by a burring process or by a pressing process; and (c) whereby a positioning of the integrated circuit element and the printed circuit board is made by having the projections provided on the external leads fitted in the holes provided in the conductor patterns thus determining the positions of the external leads of the integrated circuit element and the conductor patterns of the printed circuit boards.

4. An electrical assembly comprising:

an integrated circuit element having a body portion formed with a plurality of external leads extending from the sides thereof with at least two of said leads being provided with positioning holes extending therethrough;

a printed circuit board having an opening therein sized to receive said body portion of said integrated circuit element and having said body portion embedded therein;

conductor patterns on said printed circuit board having a specified arrangement thereof conforming to the arrangement of said external leads on said integrated circuit element to enable electrical connection between said external leads and said conductor patterns in order to form a predetermined circuit pattern;

said conductor patterns having formed therein at least two positioning holes having diameters identical with the diameters of said positioning holes in said integrated circuit element and arranged relative thereto to enable said printed circuit board and said integrated circuit element to be connected together with a predetermined relative orientation assuring a desired relative alignment between said external leads and said conductor patterns;

said positioning holes in said integrated circuit element and said positioning holes in said printed circuit board being adapted to receive therethrough a positioning tool to effect overlying alignment between said positioning holes;

said printed circuit board and said integrated circuit element being connected together in electrically conductive relationship to form said predetermined circuit pattern with said positioning holes in respective overlying alignment with each other.

5. An electrical assembly comprising:

an integrated circuit element formed with a plurality of external leads extending from sides thereof, with at least two of said leads having provided therein positioning holes extending therethrough;

a printed circuit board having conductor patterns thereon, said conductor patterns having a specified arrangement conforming to the arrangement of said external leads on said integrated circuit element to enable electrical connection between said external leads and said conductor patterns in a predetermined circuit pattern;

said external leads having forward ends thereof bent so as to be overlapped with said conductor patterns on said printed circuit board;

said conductor patterns having formed therein at least two positioning holes having diameters identical with the diameters of said positioning holes in said external leads of said integrated circuit element and arranged relative thereto to enable said printed circuit board and said integrated circuit element to be connected together with a predetermined relative orientation assuring a desired relative alignment between said external leads and said conductor patterns;

said positioning holes in said integrated circuit element and said positioning holes in said printed circuit board being adapted to receive therethrough a positioning tool to effect overlying alignment between said positioning holes;

said printed circuit board and said integrated circuit element being connected together in electrically conductive relationship to form said predetermined circuit pattern with said positioning holes in respective overlying alignment with each other.

6. An electrical assembly comprising:

an integrated circuit element formed with a plurality of external leads extending from sides thereof with at least two of said external leads being provided with projections;

a printed circuit board having conductor patterns thereon in a specified arrangement conforming to the arrangement of said external leads on said integrated circuit element to enable electrical connection between said external leads and said conductor patterns to form a predetermined circuit pattern;

said conductor patterns having formed therein at least two positioning holes configured in conformance with said projections and adapted to receive said projections therein in order to enable said printed circuit board and said integrated circuit element to be connected together with a predetermined relative orientation assuring a desired relative alignment between said external leads and said conductor patterns;

said printed circuit board and said integrated circuit element being connected together in electrically conductive relationship to form said predetermined circuit pattern with said projections extending in respective engagement within said positioningf holes.

* * * * *